(12) United States Patent
Tolpin et al.

(10) Patent No.: US 9,491,859 B2
(45) Date of Patent: Nov. 8, 2016

(54) GRID ARRAYS WITH ENHANCED FATIGUE LIFE

(71) Applicant: Massachusetts Institute of Technology, Cambride, MA (US)

(72) Inventors: Dmitry Tolpin, Sharon, MA (US); James H. Kelly, West Newbury, MA (US); Roger M. Maurais, Goffstown, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 58 days.

(21) Appl. No.: 13/901,398

(22) Filed: May 23, 2013

(65) Prior Publication Data

US 2013/0313007 A1    Nov. 28, 2013

Related U.S. Application Data

(60) Provisional application No. 61/650,602, filed on May 23, 2012.

(51) Int. Cl.
*H05K 1/11*    (2006.01)
*H05K 1/18*    (2006.01)
(Continued)

(52) U.S. Cl.
CPC ............... *H05K 1/111* (2013.01); *H05K 1/18* (2013.01); *H05K 3/30* (2013.01);
(Continued)

(58) Field of Classification Search
CPC .. H05K 1/111; H05K 3/30; H05K 2201/068; H05K 2201/094; H05K 2201/09418; H05K 2201/10242; H05K 3/3436; H05K 2201/09427; H05K 1/18; H05K 3/301; H05K 3/303; H05K 3/32; H05K 1/341; H05K 3/4007; H05K 2201/0367; H05K 2201/049; H01L 2224/16225; H01L 2924/10253; H01L 2924/00
USPC ................. 174/250–268; 361/760, 792–795; 257/686, 734, 737–738, 778, 779
See application file for complete search history.

(56) References Cited

U.S. PATENT DOCUMENTS 4,739,125 A    4/1988   Watanabe et al.
4,753,820 A    6/1988   Cusack
(Continued)

FOREIGN PATENT DOCUMENTS

JP    H08241950 A    9/1996

OTHER PUBLICATIONS

Fleisher, J., et al., "Study of Column Grid Array Components for Space Systems", *Reliability and Maintainability Symposium, (RAMS), 2012 Proceedings*, Jan. 23-26, 2012 (6 pages).
(Continued)

*Primary Examiner* — Ishwarbhai B Patel
(74) *Attorney, Agent, or Firm* — Hamilton, Brook, Smith & Reynolds, P.C.

(57) ABSTRACT

Reliability is improved for the mechanical electrical connection formed between a grid array device, such as a pin grid array device (PGA) or a column grid array device (CGA), and a substrate such as a printed circuit board (PCB). Between adjacent PCB pads, a spacing pattern increases toward the periphery of the CGA, creating a misalignment between pads and columns. As part of the assembly method, columns align with the pads, resulting in column tilt that increases from the center to the periphery of the CGA. An advantage of this tilt is that it reduces the amount of contractions and expansions of columns during thermal cycling, thereby increasing the projected life of CGA. Another advantage of the method is that it reduces shear stress, further increasing the projected life of the CGA.

14 Claims, 11 Drawing Sheets

(51) Int. Cl.
*H05K 3/30* (2006.01)
*H05K 3/34* (2006.01)

(52) U.S. Cl.
CPC .............. *H01L 2224/16225* (2013.01); *H01L 2924/10253* (2013.01); *H05K 3/3436* (2013.01); *H05K 2201/068* (2013.01); *H05K 2201/094* (2013.01); *H05K 2201/09418* (2013.01); *H05K 2201/09427* (2013.01); *H05K 2201/10242* (2013.01); *Y02P 70/611* (2015.11); *Y10T 29/4913* (2015.01); *Y10T 29/49133* (2015.01)

(56) References Cited

U.S. PATENT DOCUMENTS

| | | | |
|---|---|---|---|
| 5,610,436 | A | 3/1997 | Sponaugle et al. |
| 6,339,534 | B1 | 1/2002 | Coico et al. |
| 6,527,597 | B1 | 3/2003 | Harper, Jr. |
| 7,488,192 | B1 | 2/2009 | Eagle et al. |
| 2001/0045633 | A1 | 11/2001 | Siu et al. |
| 2002/0079577 | A1* | 6/2002 | Ho ................................ 257/737 |
| 2002/0109238 | A1* | 8/2002 | Hilton ........................... 257/778 |
| 2005/0181544 | A1* | 8/2005 | Haba et al. .................... 438/127 |
| 2006/0001159 | A1 | 1/2006 | Garcia et al. |
| 2007/0059548 | A1* | 3/2007 | Love .................... H05K 3/3436 428/610 |
| 2007/0232090 | A1 | 10/2007 | Colgan et al. |
| 2010/0184305 | A1 | 7/2010 | Brodsky et al. |
| 2010/0326714 | A1 | 12/2010 | Fukuzono |
| 2013/0025917 | A1 | 1/2013 | Chiba et al. |

OTHER PUBLICATIONS

Goddard Technical Standard, GSFC-STD-6001, Ceramic Column Grid Array Design and Manufacturing Rules for Flight Hardware, Goddard Space Flight Center, Greenbelt, MD 20771, Feb. 22, 2011 (21 pages).

Notification of Transmittal of the International Search Report and the Written Opinion of the International Searching Authority for PCT/US2013/042501, mailed Sep. 17, 2013.

Notification Concerning Transmittal of International Preliminary Report on Patentability for PCT/US2013/042501, "Grid Arrays With Enhanced Fatigue Life," mailed Dec. 4, 2014.

* cited by examiner

GRID ARRAYS WITH ENHANCED FATIGUE LIFE

RELATED APPLICATION(S)

This application claims the benefit of U.S. Provisional Application No. 61/650,602 filed on May 23, 2012. The entire teachings of the above application are incorporated herein by reference.

GOVERNMENT SUPPORT

This invention was made with government support under Contract FA8721-05-C-0002 awarded by the United States Air Force. The government has certain rights in the invention.

BACKGROUND OF THE INVENTION

Electronic components, such as but not limited to integrated circuits, may be mechanically and electrically connected to electrical contact pads on a printed circuit board (PCB) by several conventional methods, including a ball grid array (BGA), or a grid array (GA) that uses pins, such as a standard pin grid array (PGA), a land grid array (LGA) that use sockets with pins, a column grid array (CGA) that uses columns, a ceramic column grid array (CCGA), or other methods. A CCGA is a commonly used type of GA used in a variety of applications, including commercial and non-commercial applications.

CCGA packages use solder columns to establish electrical connections between a ceramic substrate (on which a silicon die is attached) and a printed circuit board. The solder columns are formed from high-melting temperature solder using an alloy of tin and lead (SnPb, also known as Tin-Lead solder). For example, in a common scenario, the length-to-width ratio of the solder columns used in a ceramic column grid array package is approximately 4:1, and the diameter of the solder columns is approximately 0.020 inches. These columns are first soldered to small copper interconnection points on the bottom of the ceramic device package, and thereafter attached to the printed circuit board, in both cases using conventional low melting temperature solder paste reflow techniques that are well-known.

Coefficient of thermal expansion (CTE) is a number that represents the dimensional change of a material per degree of temperature change. In a typical connection between an integrated circuit and a PCB, different CTEs will exist between the CCGA (or CGA) body material, the material of the solder joint, and the PCB material. Area array components are typically among the largest electronic devices on a circuit board due to the number of interconnects, but are limited in maximum size based on the effects of differential CTE of the associated materials. This relates to the performance and reliability of the electrical connections. The greater the differential displacements created by CTE mismatch during thermal changes, the greater concern for the mechanical and electrical integrity of the system. This is particularly true when finished assemblies must operate reliably in military and/or space environments, where wide temperature extremes are expected.

A problem with ceramic column grid array packages is that the solder columns are susceptible to failures due to temperature variations during CCGA device operation and CTE mismatch between the ceramic device package and the printed circuit board to which it is attached. The stress from the unequal expansion and contraction is absorbed primarily by the SnPb column and soft solder in the form of metallic grain structure deformation (strain), leading to formation of microcracks, which propagate and lead to column failure. Repetitive thermal cycles, which are inevitable with many electronic components, cause this column and solder joint integrity degradation and failure. The design and process objective for such an assembly is to ensure that probability of the first such failure is extremely low until well after specified service life has ended. For a given operational temperature range, the survival of CCGA device is inversely proportional to the number of expansions and contractions (caused by temperature cycling) of solder columns: with fewer cycles the projected life of the device is increased.

SUMMARY OF THE INVENTION

The present approaches may improve the reliability of the mechanical electrical connection formed between a GA, CGA, CCGA, PGA, LGA, or other types of grid arrays, and a PCB. Although described with reference to a CCGA, the proposed techniques are not limited to application for CCGAs, and may be applied to CGAs, PGAs, LGAs, other types of grid arrays, or other types of electronic components, integrated circuits, or electronic devices. Connecting elements are referred to as posts including columns (including but not limited to solder columns), and pins. Reliability may be improved through a Modified Pitch Surface Mount Assembly Technology method. The method may enhance fatigue life of the posts, at least by the following: a) reducing the amount of contractions and expansions of posts during thermal cycling, b.) reducing the angle of deformation in the posts when they undergo bending strain, and c.) increasing the effective length of the posts.

Certain embodiments include an electronic assembly including a printed circuit board having an array of connecting pads and a board coefficient of thermal expansion, and an electronic component having a coefficient of thermal expansion different than the board coefficient of thermal expansion. The electronic assembly further includes an array of conducting posts connecting the electronic component to the printed circuit board, a set of conducting posts of the array being angled from the electronic component to the circuit board at 20 degrees Celsius.

The proposed approach differs from the prior art in that the pad arrangement on the PCB utilizes a spacing pattern between PCB solder pads that matches the pitch of the posts near the center of the part, but which then increases progressively moving radially outward towards the corners. Thus, after placement but prior to reflow, the posts align with the pads near the center but exhibit increasing misalignment moving towards the corners, the posts being skewed away from the pad center towards the part center.

In a preferred embodiment of the proposed approach, during reflow, the solder that attaches each post to the part becomes liquid, as well as the solder paste that was applied for assembly to the PCB. In one embodiment of the proposed approach, the surface tension of the liquid solder (at both the top and the bottom of the posts) causes the posts to center on the device lands at the top and on the pads at the bottom, which results in a tilt of the posts; this tilt increases from the center of the part to the edge and corner posts due to the arrangement of pads on the PCB described above. Although solder is used to angle the posts, other connective material may be used in place of solder at the top and bottom of the post, including, but not limited to, conductive epoxys.

The connective material preferably has a lower melting point than the post, so that surface tension may be used to angle the post.

Preferably, the conducting posts of the array of conducting posts are angled when the temperature of the assembly is at the minimum temperature to be expected in service. For assemblies that must withstand the full military temperature range, this is minus 55 degrees Celsius, for example. This requirement, along with the CTE of the device and the board, is used to determine the amount of skew to be incorporated into the pad layout on the PCB. In accordance with military specifications it is preferred that the conducting posts remain angled when the temperature of the posts is in the range of −55 degrees Celsius to +125 degrees Celsius. In accordance with the commercial specifications, it is preferred that the conducting posts remain angled when the temperature of the posts is in the commercial temperature range of 0 degrees Celsius to 100 degrees Celsius. The assembly may have a connective material applied to each conducting post of the array of conducting posts, connecting each conducting post to the electronic component, and a connective material applied to each pad of the array of connecting pads, connecting each pad to a given proximate post of the array of conducting posts. The assembly may have the connective material applied to each conducting post of the array of conducting posts, connecting each conducting post to the electronic component, the connective material applied to each pad of the array of connecting pads.

The assembly may have connecting pads connected to angled posts outside of a centermost region of the electronic component that has a lesser pad thickness than the connecting pads in the centered region.

The assembly may have peripheral conducting posts of the array of conducting posts that are angled outwardly from a center of the electronic component to the circuit board. The assembly may have the board coefficient of expansion greater than the electronic component coefficient of thermal expansion and conducting posts of the array of conducting posts angled outwardly from a center of the electronic component to the circuit board. The assembly may have the array of conducting posts as an array of conducting columns connected at lands of the electronic component with solder and connected to pads of the printed circuit board with solder.

The assembly may have a connective material that connects each conducting post of the array of conducting posts to the electronic component, and a connective material connects each conducting post of the array of conducting posts to a pad. The connective material may be solder.

The assembly may have each post of the array of conducting posts connected to a pad by solder. The assembly may have each post of the array of conducting posts comprised of solder, and each post of the array of conducting posts connected to a land of the electronic component with solder. The assembly may have each post of a center sub-array of the array of conducting posts as vertical, and each post not within the center sub-array as angled. The assembly may have angled conducting posts of the array angled at an increasing angle toward a periphery of the electronic component. The assembly may have angled conducting posts including outermost conducting posts of the electronic component, proximate to a periphery of the electronic component and at least posts inward of the outermost conducting posts of the electronic component. The angled conducting posts of the array may include peripheral conducting posts.

The assembly may have a device including an electronic component with a group of conducting posts connected to lands, the electronic component having a first coefficient of thermal expansion and a printed wiring board with a group of pads, the printed wiring board having a second coefficient of thermal expansion greater than the first coefficient of thermal expansion. The group of pads may be placed on the printed wiring board, the group of pads associated with a group of conducting posts on the electronic component, such that a first set of at least one pad of the group of pads is aligned with an associated first set of at least one conducting post of the group of conducting posts, and the first set of at least one conducting post of the group of conducting posts is located centermost to the electronic component. There may be an initial gap distance which is a constant value, between any adjacent pads of the first set of at least one pad of the group of pads. A remaining set of pads of the group of pads may be misaligned at 20 degrees Celsius with a corresponding set of lands of the electronic component, by creating increased gap distance between adjacent pads of the remaining set of pads of the group of pads, the increased gap distance being greater than the initial gap distance. The electronic component may connect to the printed wiring board through a connection process such that each given conducting post of the group of conducting posts connects to an associated proximate pad of the set of pads. Furthermore, each given conducting post of the remaining set of conducting posts obtains an angular tilt away from the center of the electronic component toward a periphery of the electronic component at 20 degrees Celsius. The device may have a constant value for the increased gap distance.

An assembly of the proposed approach may have a printed circuit board having an array of connecting pads and a board coefficient of thermal expansion, an electronic component having coefficient of thermal expansion less than the board coefficient of thermal expansion, and an array of conducting posts connected to the electronic component at respective lands, and connecting the electronic component to the printed circuit board. Peripheral conducting posts of the array may be angled outwardly from the electronic component to the circuit board when the temperature is in a range of 0 degrees Celsius to plus 100 degrees Celsius. Solder may connect each post of the array of conducting posts to a land of the electronic component and to a pad of the printed circuit board and each post of the array of conducting posts may be comprised of solder.

An assembly method of the proposed approach may include placing an array of pads on the printed circuit board and applying connective material to the pads. The method may further include providing an electronic component, having an array of conducting posts, pads of the array of pads being misaligned with conducting posts of the array of conducting posts. The method may further include mounting the electronic component to the circuit board with the array of conducting posts connected to the array of pads with ends of the conducting posts drawn into closer alignment with the pads, conducting posts of the array of conducting posts being angled from the electronic component to the circuit board when at 20 degrees Celsius.

The method may further include connecting pads connected to angled posts outside of a centermost region of the electronic component have a lesser pad thickness than the connecting pads in the centermost region. The method may further include peripheral conducting posts of the array being angled outwardly from a center of the electronic component to the circuit board. The method may further include a board coefficient of expansion greater than an electronic component coefficient of thermal expansion and conducting posts of the array of conducting posts angled outwardly from a center of the electronic component to the circuit board. The method may further include the array of conducting posts as an array of conducting columns connected at lands of the electronic component with solder and connected to pads of the printed circuit board with solder.

The method may further include conducting posts angled when the temperature is in a range of minus 55 degrees Celsius to plus 125 degrees Celsius. The method may further include conducting posts angled when the temperature is in a range of 0 degrees Celsius to plus 100 degrees Celsius. The method may further include solder connecting each pad to a given post of the array of conducting posts, and the peripheral conducting posts being angled due to surface tension after placement but prior to reflow. The method may further include solder connecting each pad to a given post of the array of conducting posts, the given post comprised of solder, and solder connecting the given post to each land on the electronic component.

The method may further include each post of a center sub-array of the array of conducting posts being vertical, and each post not within the center sub-array being angled. The method may further include each conducting post of the array of conducting posts being angularly straight and perpendicular with respect to the electronic component, prior to mounting the electronic component to the printed circuit board. The method may further include angled conducting posts of the array being angled at an increasing angle toward a periphery of the electronic component.

A method of the approach may include placing a group of pads on the printed wiring board, the group of pads associated with a group of conducting posts connected to lands on the electronic component. A first set of at least one pad of the group of pads may be aligned with an associated first set of at least one conducting post of the group of conducting posts, and the first set of at least one conducting post of the group of conducting posts is located centermost to the electronic component, where there is an initial gap distance which is a constant value, between any adjacent pads of the first set of at least one pad of the group of pads. A remaining set of pads of the group of pads may be misaligned at 20 degrees Celsius with a corresponding set of lands of the electronic component, by creating increased gap distance between adjacent pads of the remaining set of pads of the group of pads, the increased gap distance being greater than the initial gap distance. The method may connect the electronic component to the printed wiring board through a connection process such that each given conducting post of the group of conducting posts connects to an associated proximate pad of the set of pads. In the method, each given conducting post of the remaining set of conducting posts may have an angular tilt outwardly away from the center of the electronic component toward a periphery of the electronic component at 20 degrees Celsius. In the method, the increased gap distance may be a constant value.

A method of assembling an electronic component onto a printed circuit board may include placing an array of pads on the printed circuit board, the printed circuit board having a coefficient of thermal expansion. The method may further include providing the electronic component, the electronic component having a coefficient of thermal expansion less than the coefficient of thermal expansion of the printed circuit board. An array of conducting posts may be connected to the electronic component at respective lands, pads of the array of pads being misaligned with given conducting posts of the array of conducting posts. Each given conducting post may becoming more misaligned, toward a periphery of the electronic component. The method may have a coefficient of thermal expansion for the printed circuit board that is greater than a coefficient of thermal expansion for the electronic component. Solder may be connected to each post of the array of conducting posts to a land of the electronic component and to a pad of the printed circuit board. The electronic component may be mounted to the circuit board with the array of conducting posts connected to the array of pads, conducting posts of the array of conducting posts being angled outwardly from the electronic component to the circuit board, due to surface tension after placement but prior to reflow, and the peripheral conducting posts remaining outwardly angled when the temperature is in a range of 0 degrees Celsius to plus 100 degrees Celsius.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

Surface mount assembly technology (SMT) is used to assemble CGAs or CCGAs to a printed circuit board (PCB). Note, the proposed approach here is ceramic (uses a CCGA), and although CGAs are mentioned, CCGAs may be used.

However, the proposed approach is not limited to being ceramic. The CGA component is mounted directly onto the surface of the PCB. For electrical and mechanical interconnection, this surface is fabricated with flat copper areas, called pads, that are arranged (rows, columns, and pitch) to match the corresponding arrangement of SnPb columns on the device itself. These pads are plated in SnPb, silver, or gold, and connected electrically to the circuitry within the board as specified in the design schematic.

Solder paste is first applied to the solder pads using screen (stencil) printing or another application method. Solder paste comprises tiny spheres of solder alloy (typically tin alloy or tin/lead, as desired) suspended in a matrix of flux. The flux is selected to "activate" at a lower temperature than the melting point of the solder spheres so as to chemically clean the surfaces being soldered prior to the solder flowing. The CGA then is placed on the board utilizing a computer controlled pick and place machine, or manually with assistance of a special fixture to ensure alignment of CGA columns to PCB pads. The boards are then conveyed into the reflow soldering oven where the rising temperature first activates the flux, and then melts the solder, which flows smoothly onto the column and the pad. The surface tension of the molten solder helps keep the components in place, and if the solder pad geometries are correctly designed, surface tension automatically aligns the components to their pads. As the assembly cools back below the liquidus temperature, the solder solidifies while wetted to the column and PCB pad, effecting a permanent electrical and mechanical interconnection, or solder joint.

Figure 1A:
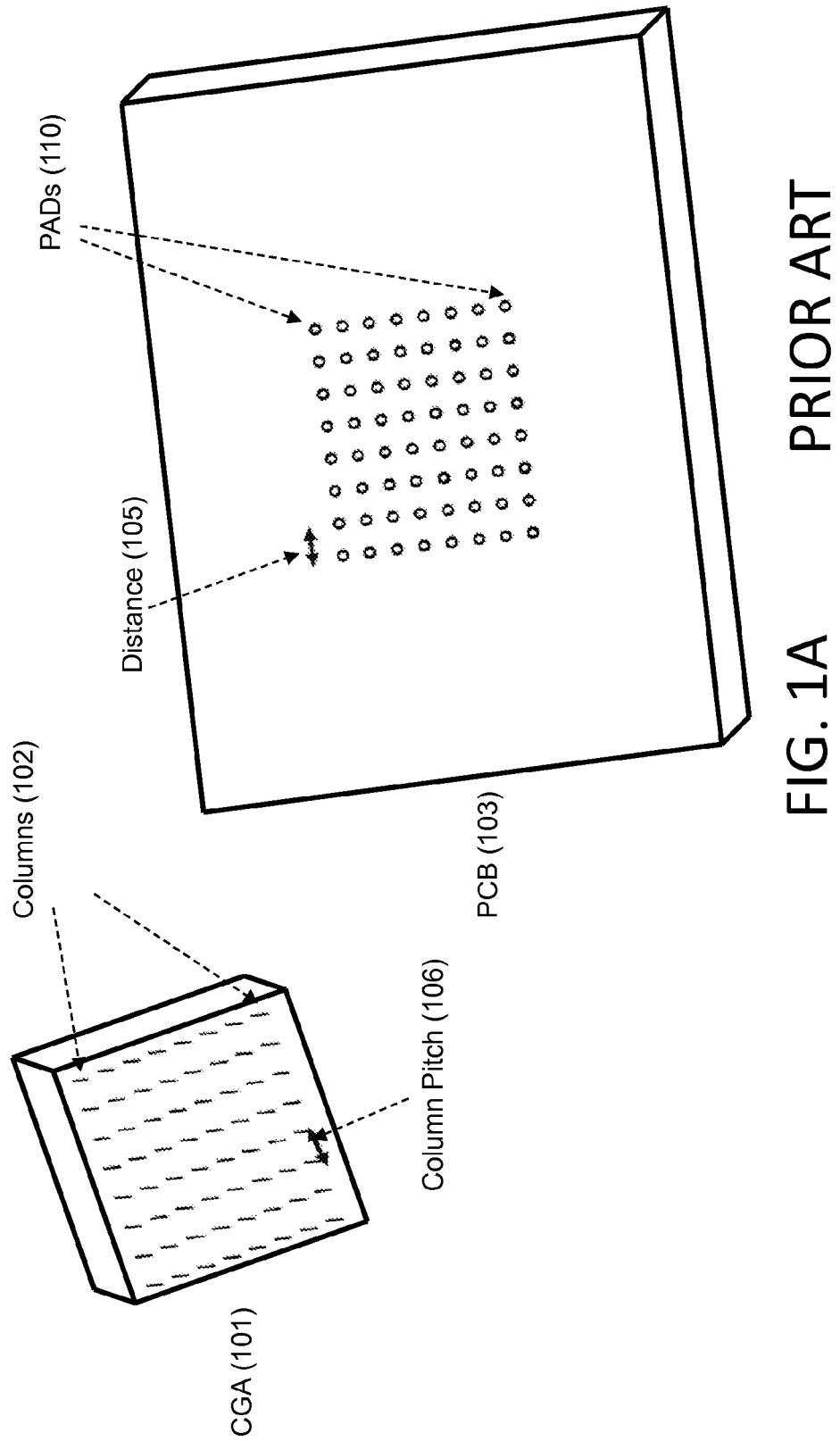
FIG. 1A illustrates a 3-dimensional view of an assembly of the prior art at room temperature.

FIG. 1A illustrates a 3-dimensional view of an assembly of the prior art at room temperature. The conventional assembly method of CGA 101 described above is based on a commonly accepted practice of SMT design: the solder pads 110 are evenly spaced 105 on the PCB 103 and the distance between them 105 is equal to the CGA column pitch 106 for the CGA columns 102. This method of assembly is illustrated in FIG. 1A where the columns 102 are in a neutral (at room temperature) stage of the thermal cycle and are perpendicular to the PCB 103. Note that all columns 102 in FIG. 1A are straight, not tilted, and perpendicular to the CGA 101. In the example in FIG. 1A, sixty-four columns exist, including eight rows of eight columns per row as shown. More or fewer columns may be used. Typically, many more columns are used, such as an array of 25×25; however, one skilled in the art realizes that for ease of presentation an array of 8×8 is shown here and more or fewer columns may be used.

Figure 1B:
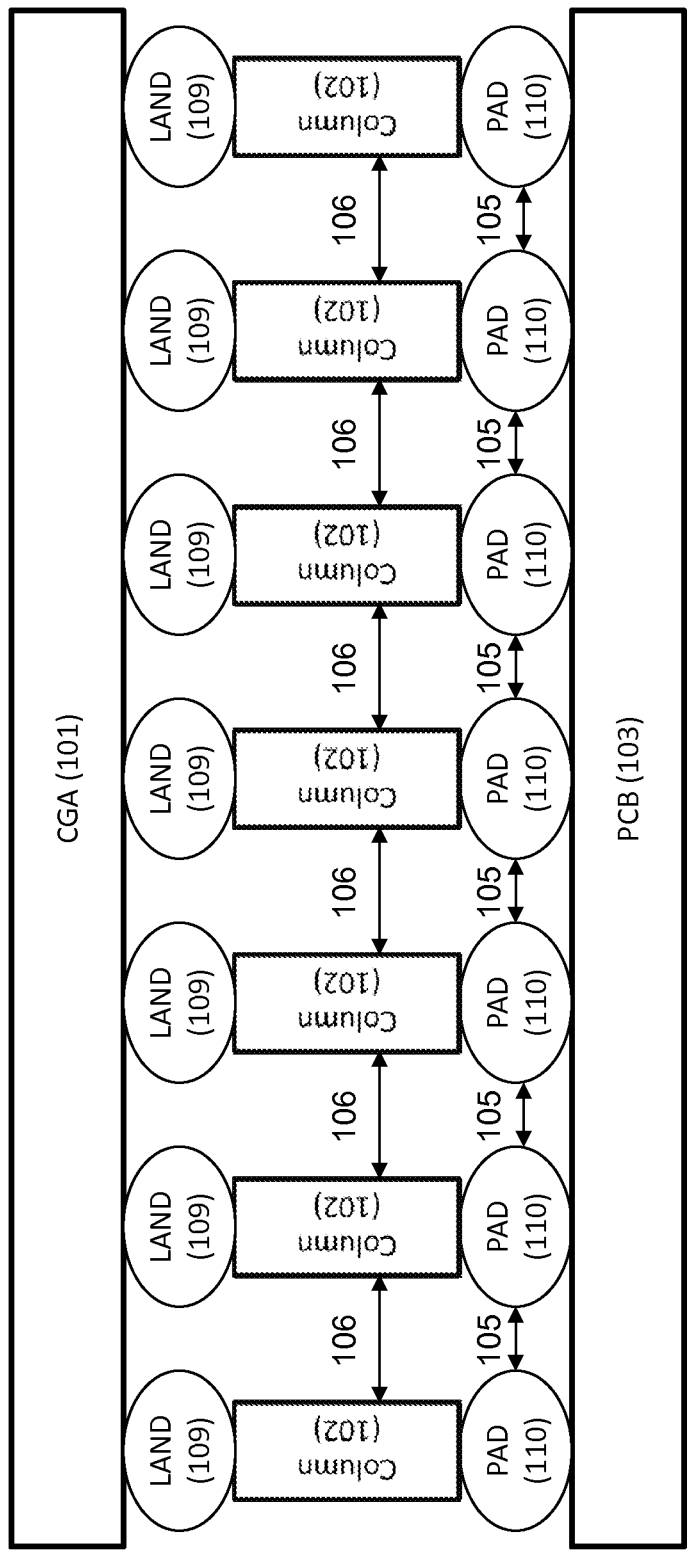
FIG. 1B illustrates a 2-dimensional view of an assembly of the prior art at room temperature.

FIG. 1B illustrates a 2-dimensional view of an assembly of the prior art at room temperature. Although not shown in the figure, one skilled in the art realizes that the approach shown in FIG. 1A scales to three dimensions and not just two dimensions. FIG. 1B illustrates a 7×7 array of columns from a 2-dimensional view. Each column 102 in FIG. 1B depicts a row of seven columns. FIG. 1B also illustrates that columns may also have lands 109 at the CGA. Although not shown in FIG. 1B, the lands 109 connect to the top ends of the columns 102 using solder and the pads 110 connect to the bottom ends of the columns 102 using solder.

Figure 1C:
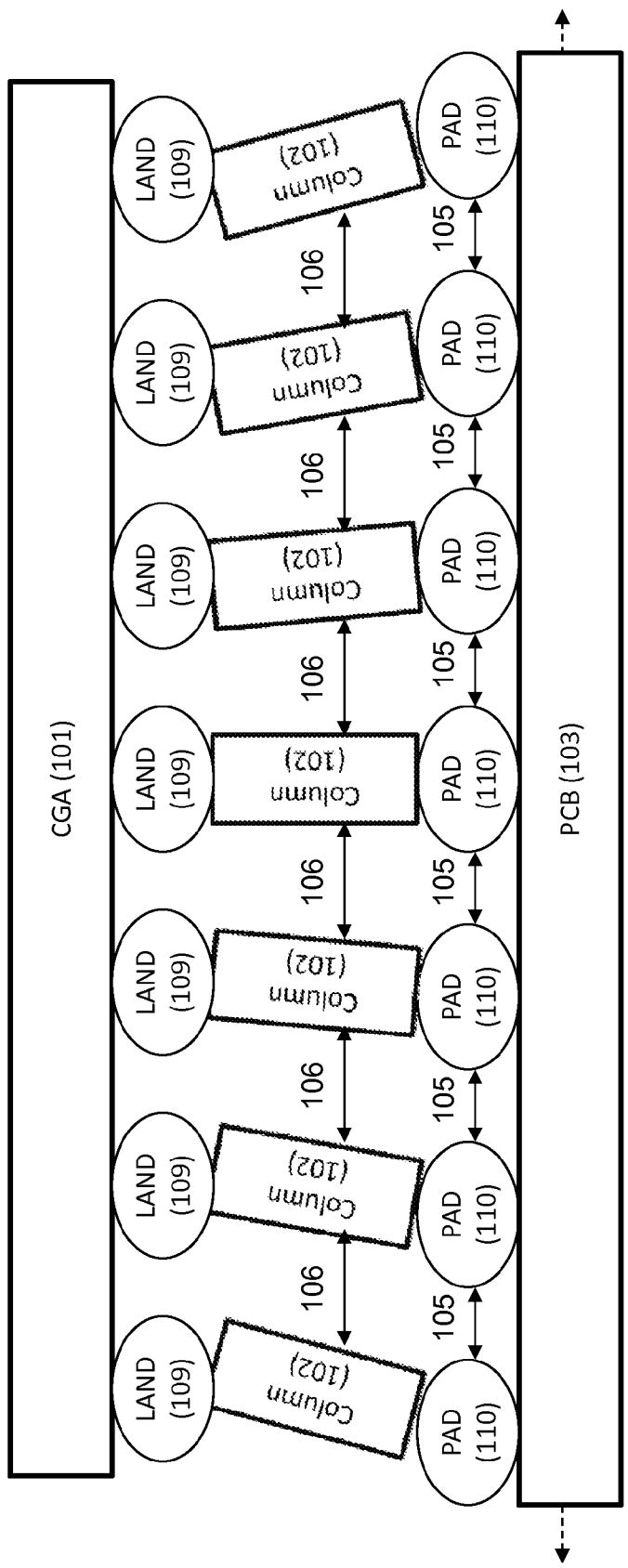
FIG. 1C illustrates the assembly of FIG. 1B during heating above room temperature.

FIG. 1C illustrates the assembly of FIG. 1B during heating above room temperature. In FIG. 1B, the CTE of the PCB 103 is greater than the CTE of the CGA 101, so the PCB 103 expands, resulting in a shift of the pads 110, and the columns tilt outwardly.

Figure 1D:
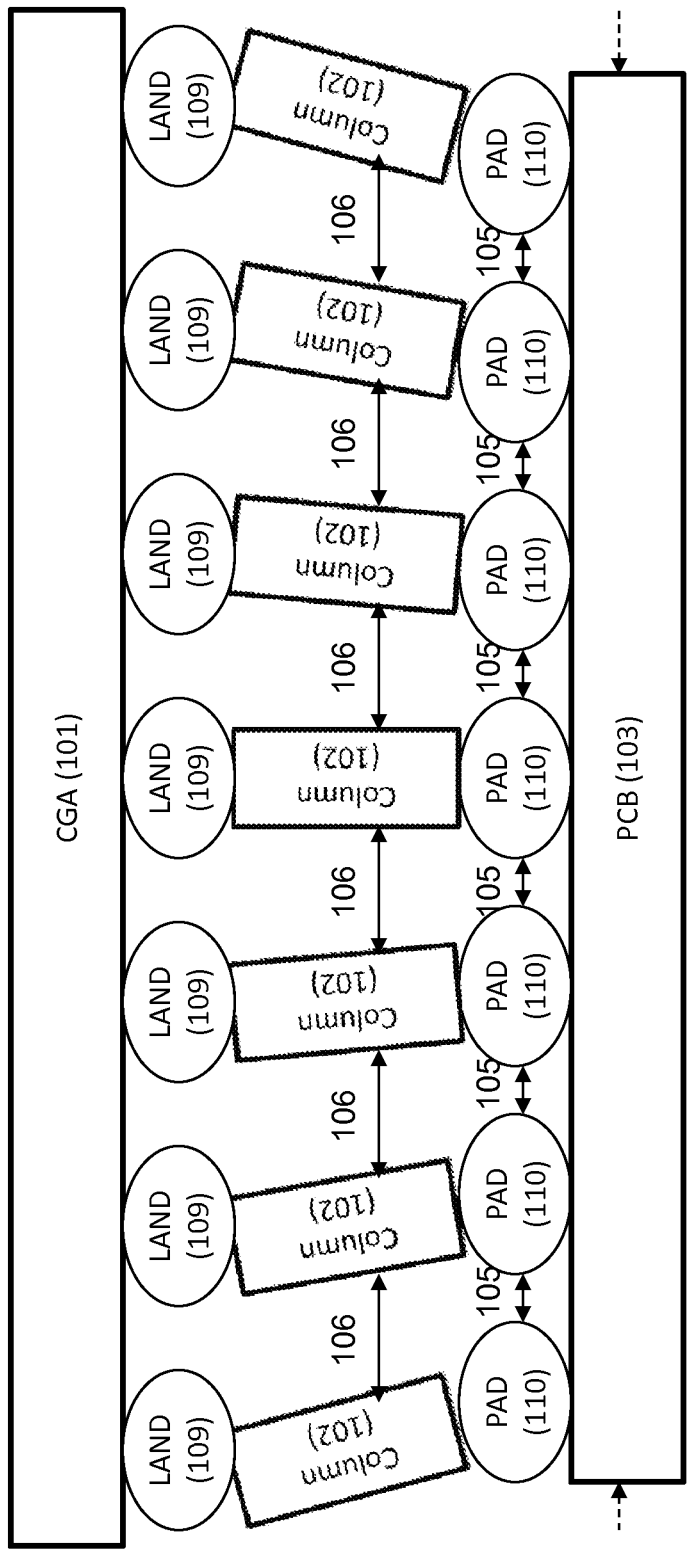
FIG. 1D illustrates the assembly of FIG. 1B during cooling below room temperature.

FIG. 1D illustrates the assembly of FIG. 1B during cooling below room temperature. In FIG. 1C, the CTE of the PCB 103 is greater than the CTE of the CGA 101, so the PCB 103 contracts, resulting in a shift of the pads 110, and the columns tilt inwardly.

Figure 2A:
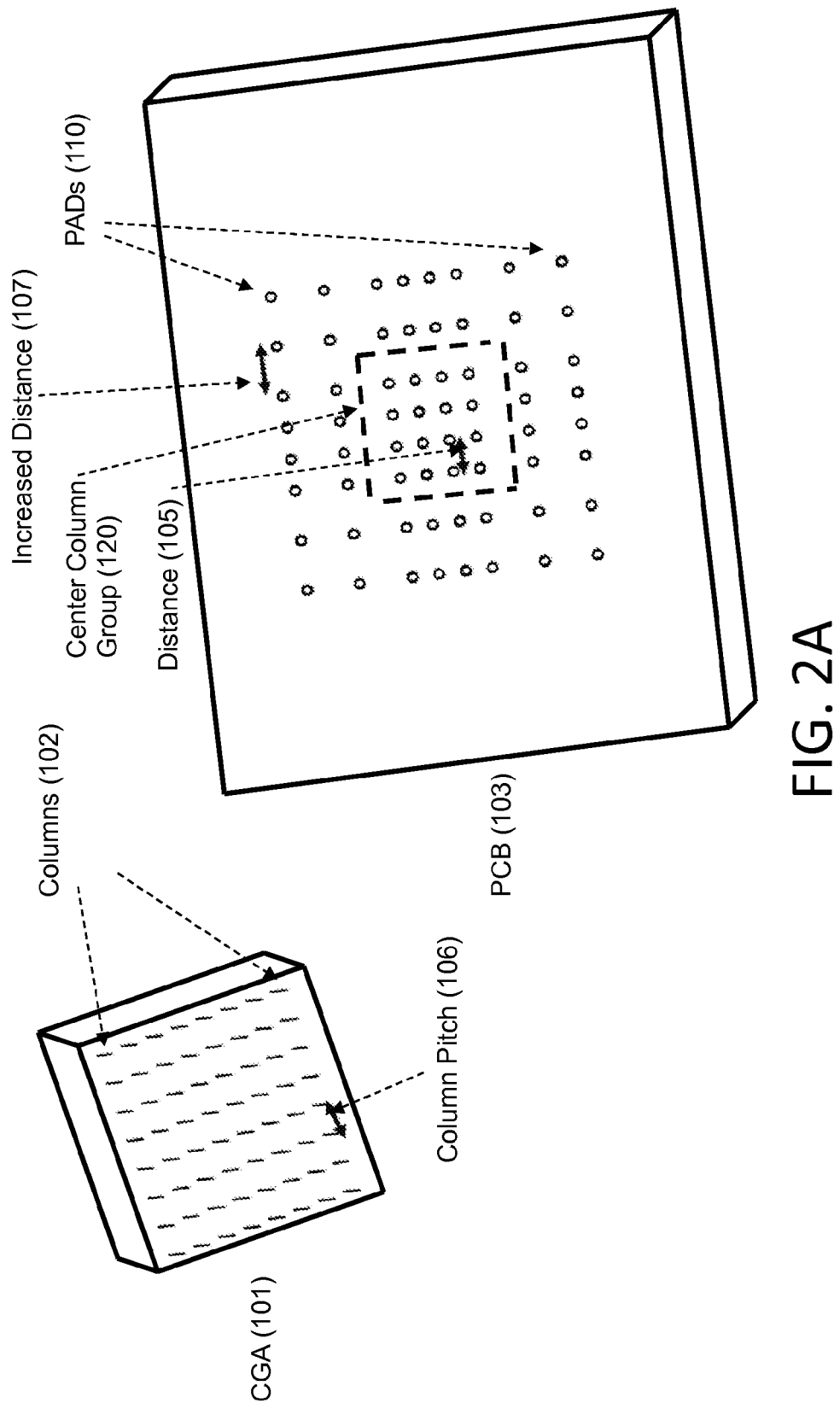
FIG. 2A illustrates a 3-dimensional view of one embodiment of the present invention at room temperature, prior to an assembly method of the present invention.

FIG. 2A illustrates a 3-dimensional view of one embodiment of the proposed approach at room temperature, prior to an assembly method of the proposed approach. Note that all columns 102 in FIG. 2A are preferably straight, not tilted, and perpendicular to the CGA 101. As shown in FIG. 2A, the proposed approach differs from the prior art in that the pad arrangement on the PCB 103 utilizes a spacing pattern 105 between PCB solder pads 110 that matches the pitch 106 of the columns 102 near the center of the CGA 101, but the spacing pattern which then increases 107 progressively moving radially outward towards the corners. One or more center-most columns form a center column group 120 that has a given initial spacing between center-most columns 105, if the center column group 120 has more than one column. The given initial spacing 105 equals the column pitch spacing 106 of the CGA columns. All remaining columns outside of the center-most column group 120 are in a peripheral column group. As shown in FIG. 2A, the remaining columns outside of the center-most column group 120 have an increased spacing pattern 107, radially outwards from the center of the CGA, that is greater than the initial spacing 105 pattern. After assembly, all columns 102 that are part of the peripheral column group which is outside of the center-most column group 120, are angled outward, at an increasing angle toward the outermost columns of the CGA. For example, the outer-most peripheral column is more outwardly angled than the inner-most peripheral column. The angle increases outwardly, even if the increase in pitch 107 is constant. The angle of the columns which are not part of the center-most column group 120, is a sufficient angle such that the difference in CTE between the PCB and the CGA does not cause the columns outside of the center-most column group 120 to reach, or pass through, a vertical position, throughout the military temperature range of minus 55 degrees Celsius to plus 125 degrees Celsius.

Columns that are peripheral-most to the CGA have an increased spacing pattern 107, and columns between the peripheral-most columns and the center-most column group 120, have an increased spacing pattern 107. The increase in spacing 107 is not required to be constant, however, a constant increase in spacing 107 is preferable. Note also, in yet another embodiment, which is not the preferred embodiment, columns 102 may be tilted prior to placement on the PCB 103.

In another alternative embodiment, not shown in FIG. 2A, the CTE of the PCB may be less than the CTE of the CGA.

Although not shown in FIG. 2A, as an alternative embodiment, the angle may increase inwardly, from the center of the CGA to the periphery of the CGA. Center-most column groups still retain the initial pitch 105. In this alternative embodiment, the pitch 107 outside of the center-most column group 120, decreases compared to the initial pitch 105 and the decrease is not required to be constant, however, in the alternative embodiment, a constant decrease is preferable. In this alternative embodiment, the CTE of the PCB may be less than the CTE of the CGA, or the CTE of the PCB may be greater than the CTE of the CGA.

Figure 2B:
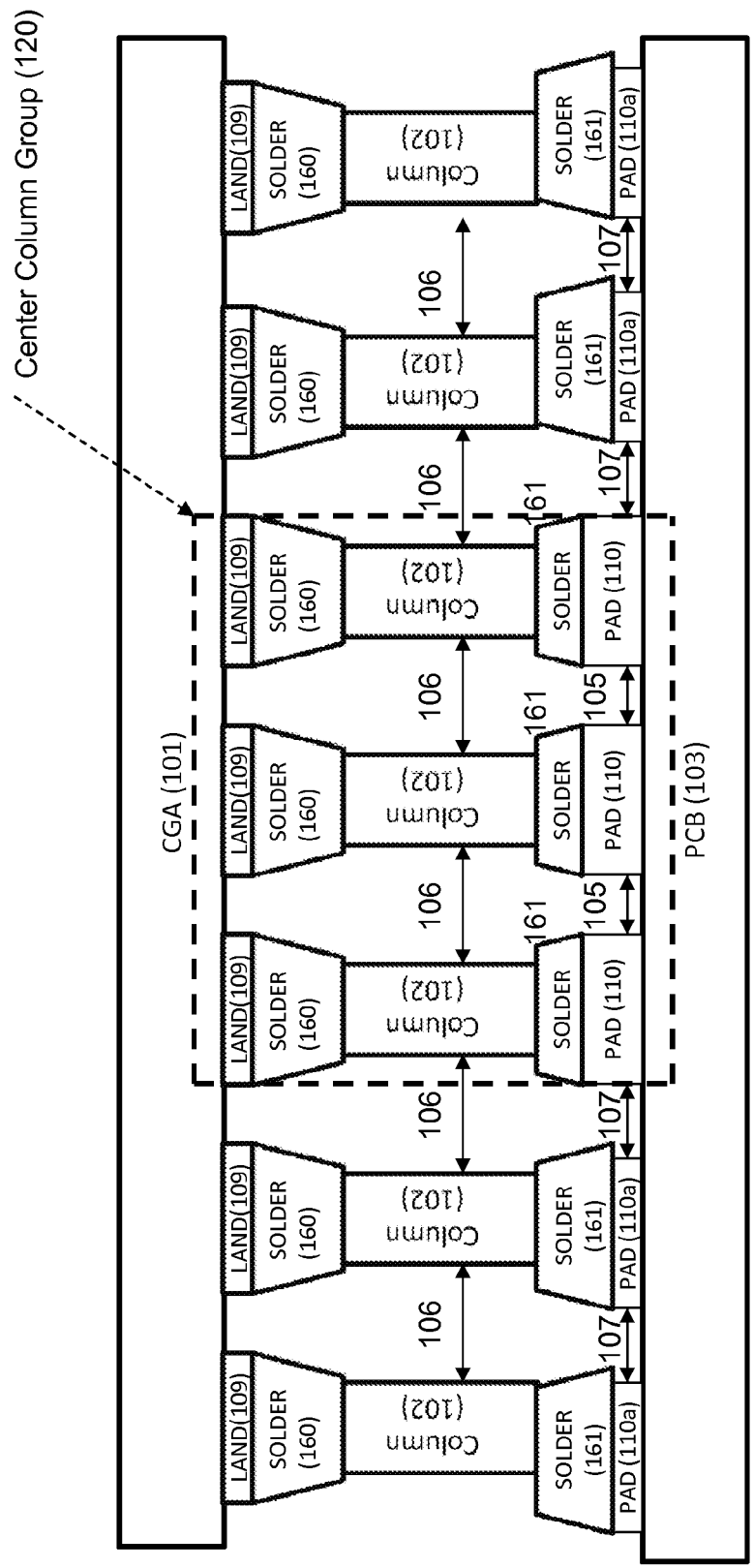
FIG. 2B illustrates a 2-dimensional view of one embodiment of the present invention at room temperature, prior to an assembly method of the present invention.

FIG. 2B illustrates a 2-dimensional view of one embodiment of the proposed approach at room temperature, prior to an assembly method of the proposed approach. Although not shown in the figure, one skilled in the art realizes that the approach shown in FIG. 2B scales to three dimensions and not just two dimensions. As shown in FIG. 2B, the center column group 120 may include multiple columns that have an initial spacing 105 that matches the pitch 106, and the remaining columns form a peripheral column group that has an increased spacing 107 that is greater than the pitch 106. FIG. 2B further illustrates that it is preferable that pads within the center column group 110 have a greater thickness than the pads outside of the center column group 110*a*. The standard difference of thickness between pads in the center column group and pads outside of the center column group is 0.005 inches, however, greater or smaller differences of thicknesses may be used. This difference in thickness allows for the columns to float more easily in the liquid solder at the top near the lands 160 and the liquid solder at the bottom near the pads 161, and allows for improved angling and alignment of the columns.

Figure 2C:
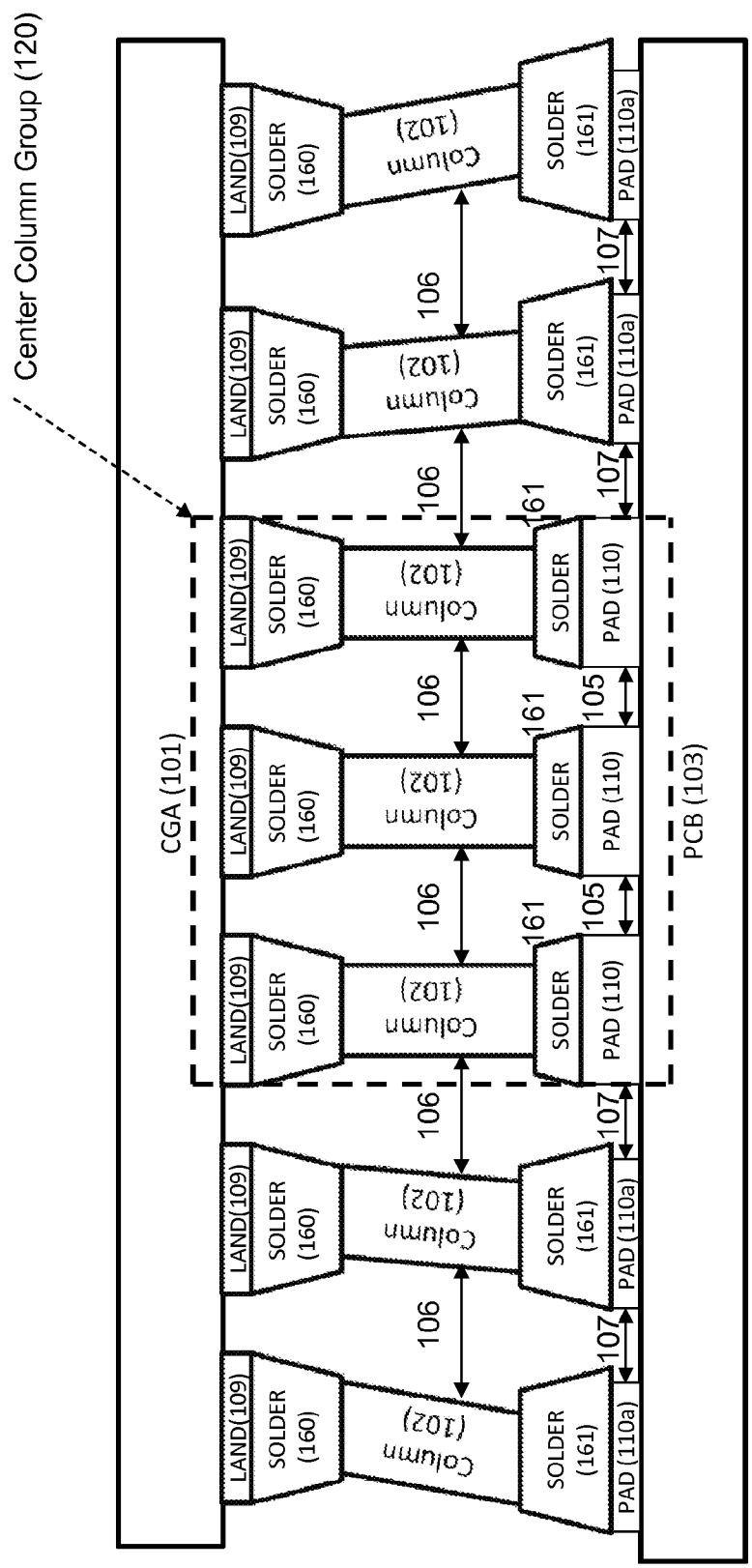
FIG. 2C illustrates the embodiment of the present invention of FIG. 2B, at room temperature, after an assembly method of the present invention.

FIG. 2C illustrates the embodiment, at room temperature, of the proposed approach of FIG. 2B, after an assembly method of the proposed approach. As shown in FIG. 2C, as part of the assembly method of the proposed approach, preferably after placement but prior to reflow, the columns 102 align with the pads near the center of the CGA 101 but exhibit increasing misalignment moving towards the corners of the CGA 101, the columns 102 being skewed away from the PCB pad center towards the CGA part center. Preferably, this results in an increasing angular tilt outwardly of the columns 102 as columns 102 progress from the center of the CGA to the periphery of the CGA.

Figure 2D:
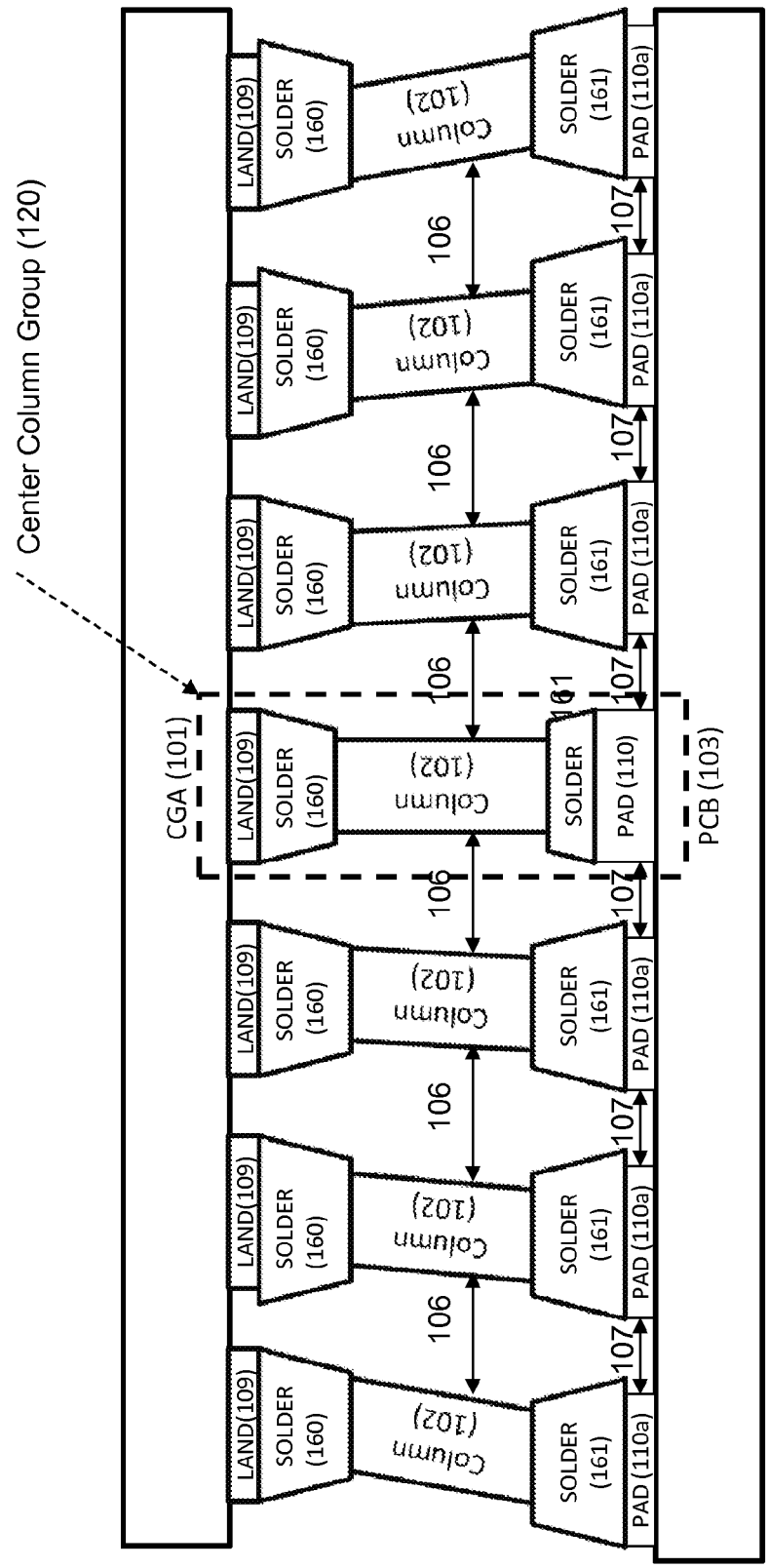
FIG. 2D illustrates another embodiment of the present invention, at room temperature, after an assembly method of the present invention.

FIG. 2D illustrates another embodiment of the proposed approach, at room temperature, after an assembly method of the proposed approach. In FIG. 2D the increased spacing pattern 107 affects more columns 102 than in FIG. 2A. FIG. 2D illustrates that multiple rows of columns 102 may be tilted and column tilt is not limited to columns that are peripheral to the CGA 101. FIG. 2D further illustrates that, optionally, the centermost column group 120 may include one column only.

As shown in FIGS. 2C and 2D, all columns 102 that are part of the peripheral column group, outside of the centermost column group 120, are angled outward, at an increasing angle that increases toward the outermost columns of the CGA. The angular tilt is retained outwardly through the full military temperature range of minus 55 to plus 125 degrees Celsius, although the tilt may be lessened or increased depending on the temperature and the CTEs of the circuit board and the CGA.

Referring to FIG. 2A, in a preferred embodiment of the proposed approach, the spacing pattern 107 is increased compared with initial distance 105 but the increase is constant across multiple rows moving toward the periphery of the CGA, resulting in an increasing angular tilt moving from the center toward the periphery of the CGA. In a preferred embodiment, one or more center columns are allowed, and when multiple center columns are used, the center distance 105 applies. In a preferred embodiment, one or more non-center columns are used, and the peripheral distance 107 is used between the non-center columns. The non-center columns include but are not limited to, the peripheral columns.

In another embodiment of the proposed approach, the spacing pattern is increased 107 with each gap between successive columns, moving toward the periphery from the center, as opposed to constant, resulting in an even greater increasing angular tilt moving from the center toward the periphery of the CGA. In an alternative embodiment, the increased spacing pattern 107 remains greater than the centermost spacing pattern 105, but the increased spacing pattern 107 decreases when moving outwardly toward the periphery. In yet another embodiment, multiple rows of centermost columns have a standard distance 105 and a group of multiple rows of columns have an increasing distance 107 toward the periphery.

Preferably, during an optional reflow stage of the assembly process, the solder that attaches each column to the part becomes liquid, as well as the solder paste that was applied for assembly to the PCB. The surface tension of the liquid solder (both top and bottom of the columns) causes the columns to center on the pads top and bottom, which results in a tilt of the columns; this tilt increases from the center of the part to the edge and corner columns due to the arrangement of pads on the PCB described above. This method of assembly is illustrated in FIG. 2D where columns in neutral (at room temperature) stage of the thermal cycle are tilted, not perpendicular to the PCB 103. This solder structure which provides fewer contractions and expansions during a single thermal cycle of the device enhances the fatigue life properties over the conventional assembly method.

Figure 2E:
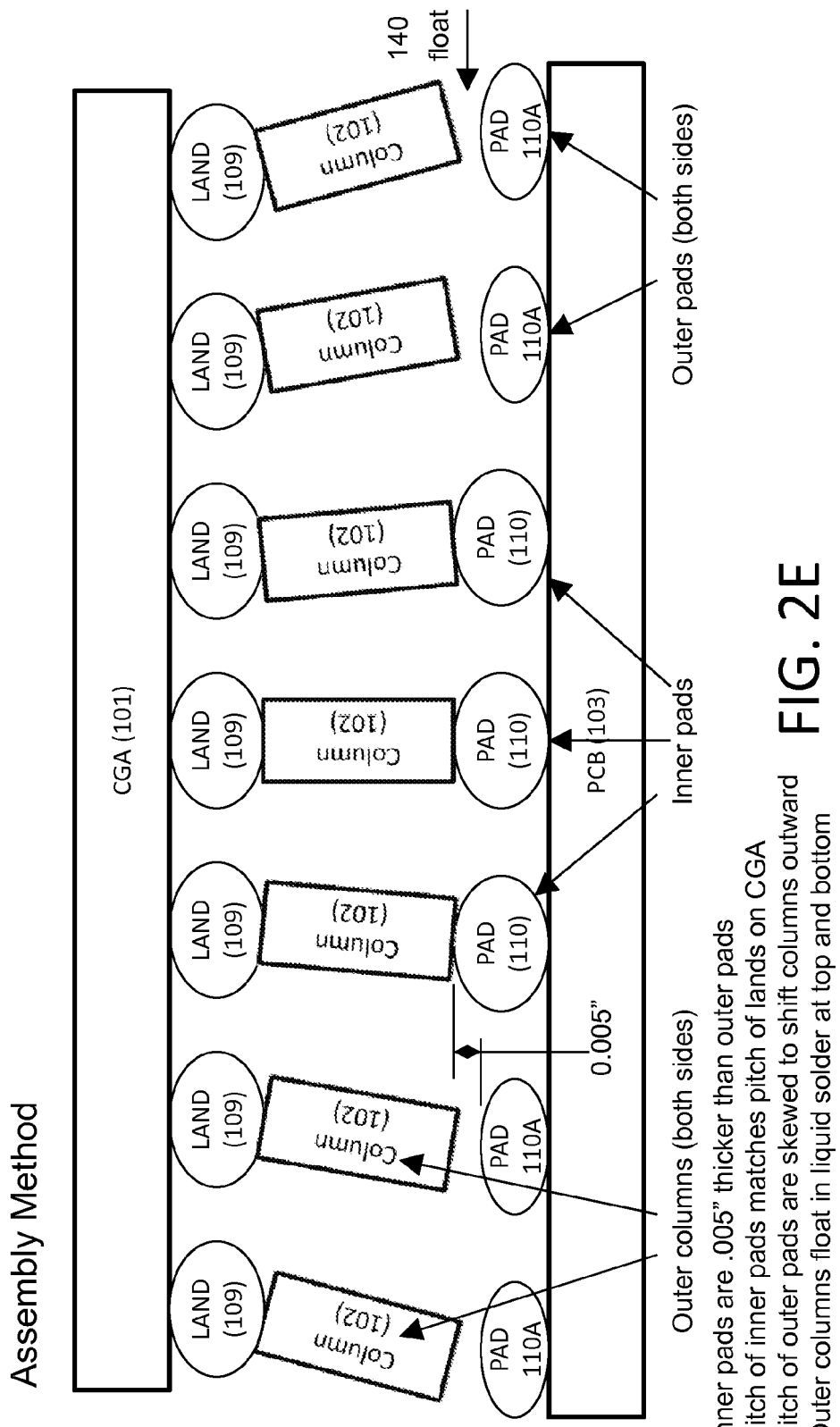
FIG. 2E illustrates another view of the method of assembly.

FIG. 2E illustrates another view of the method of assembly. Although not shown in FIG. 2E, solder is used at the top of each column to connect with lands and at the bottom of each column to connect with pads. In addition to the elements previously included in other figures, FIG. 2E highlights the outer pads 110*a* associated with the outer columns 121, the outer pads having a reduced thickness compared to the inner pads 110. FIG. 2E further illustrates that reduced pad thickness for the outer pads 110*a* allows the columns 102 to have an increased float 140 in the solder that helps with column placement using the proposed approach.

Figures 3A, 3B:
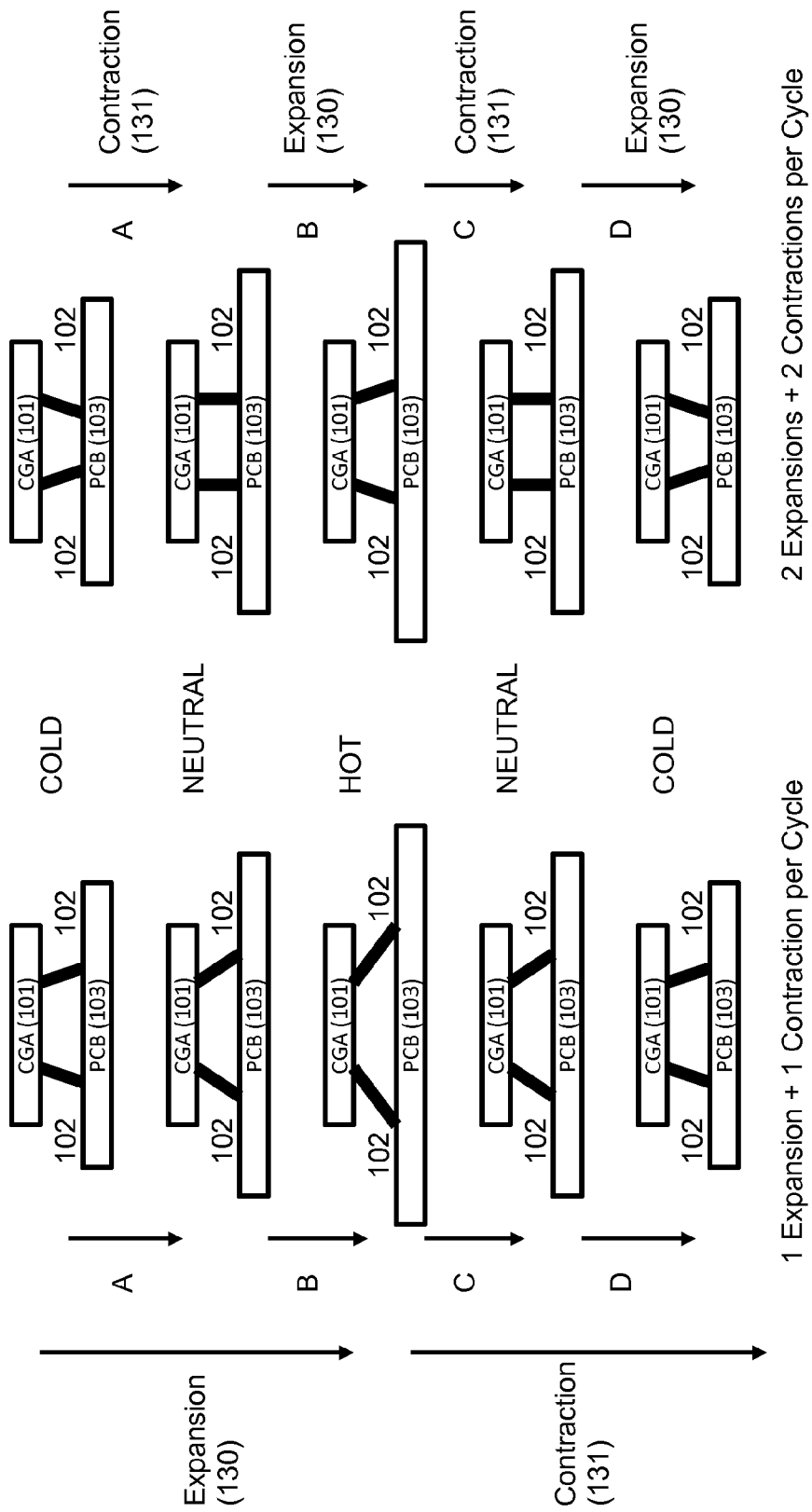
FIG. 3A illustrates a thermal cycle applied to embodiments of the present invention.
FIG. 3B illustrates the thermal cycle of FIG. 3A applied to the prior art.

Thermal cycles are depicted in FIG. 3A and FIG. 3B. FIG. 3A illustrates a thermal cycle applied to the proposed approach and FIG. 3B illustrates the same thermal cycle applied to the prior art. In FIG. 3A and FIG. 3B, note that the term contraction 131 refers to contraction (compression) of the columns, and expansion 130 refers to expansion (tension) of the columns 102. The PCB expansion and contraction process is the same between FIG. 3A and FIG. 3B. By contrast, in FIG. 3A and FIG. 3B, the process of column expansion 130 and column contraction 131 is different because the prior art experiences twice as many column contraction 131 and column expansion 130 thermal cycles as the proposed approach.

A thermal cycle of a CGA consists of 4 stages, "A," "B," "C," and "D," as shown in FIG. 3A and FIG. 3B:

Stage "A" is the "Cold to Neutral" stage in which the device is in transition from "Cold" (minimum) to "Neutral" (room) temperature of the cycle. In the prior art conventional assembly method of FIG. 3B, the columns tilted towards each other at the "Cold" position shift into vertical (perpendicular to the body of CGA) position and are exposed to contraction forces (compressed) during this shift. In stage "A", in the assembly method of the proposed approach in FIG. 3A, the columns tilted away from each other at "Cold" position shift further away from each other and exposed to expansion forces (stretched) during the shift.

Stage "B" is the "Neutral to Hot" stage in which the device is in transition from "Neutral" to "Hot" (maximum) temperature of the cycle. In the prior art conventional assembly method of FIG. 3B, the columns perpendicular to the device at "Neutral" position shift away from each other and exposed to expansion forces (tension) during this shift. In stage "B", in the assembly method of the proposed approach in FIG. 3A, columns tilted away from each other at "neutral" position shift further away from each other and are exposed to expansion forces (tension) during the shift.

Stage "C" is the "Hot to Neutral" stage in which the device is in transition from maximum temperature back to "Neutral" temperature of the cycle. In stage "C", in the prior art conventional assembly method of FIG. 3B, columns tilted away from each other at "Hot" position shift perpendicular to the device position and are exposed to contraction forces (compressed) during the shift. In stage "C", in the assembly method of the proposed approach in FIG. 3A, columns tilted away from each other at a "Hot" position shift closer towards each other and are exposed to contraction forces (compressed) during the shift.

Stage "D" is the "Neutral to Cold" stage in which the device is in transition from "Neutral" to "Cold" temperature of the cycle. In stage "D", in the prior art conventional assembly method of FIG. 3B, columns perpendicular to the device at "Neutral" position shift towards each other and are exposed to expansion forces (tension) during this shift. In stage "D", in the assembly method of the proposed approach in FIG. 3A, columns are tilted away from the central line of the device at "Neutral" position shift towards each other and are exposed to contraction forces (compressed) during this shift.

Below, Table 1 summarizes the sequence of events and amount of contractions and expansions during one thermal cycle of a typical CGA device utilizing conventional prior art method of FIG. 3B and an embodiment of the proposed approach of FIG. 3A.

TABLE 1

Comparison of Prior Art Method vs. Proposed Method

| Stages | Method | |
| --- | --- | --- |
| | Prior Art | Proposed Method |
| A - Cold to Neutral | Contraction | Expansion |
| B - Neutral to Hot | Expansion | |
| C - Hot to Neutral | Contraction | Contraction |
| D - Neutral to Cold | Expansion | |

One advantage of the proposed approach is that since the number of contractions and expansions of vulnerable solder columns during thermal cycling of a CGA is reduced by 50%, the proposed approach has improved reliability and lower frequency of column failure, including but not limited to, column cracking failures. The proposed approach is advantageous over the conventional prior art methods and extends the life of a typical device.

Another advantage of the proposed approach is that it reduces the probability of column cracks because the column stress load shifts from the column shear stress (bending) of the prior art approach, to a greater compressive or expansive stress in the proposed approach. As shown in FIG. 3B, the prior art experiences shear stress (bending) when changing the bending position from straight-to-inward, or straight-to-outward. By contrast, as shown in FIG. 3A, the proposed approach preferably does not shift from straight-to-inward or straight-to-outward, rather, it remains outward, so bending stress is much less compared with the prior art. Since a given amount of stress applied as shear stress (bending) is potentially more likely to result in a column failure than a given equivalent amount of compression stress or tension stress, the proposed approach is less susceptible to stress failures, including but not limited to one or more fractures or cracks of one or more columns.

Figure 4:
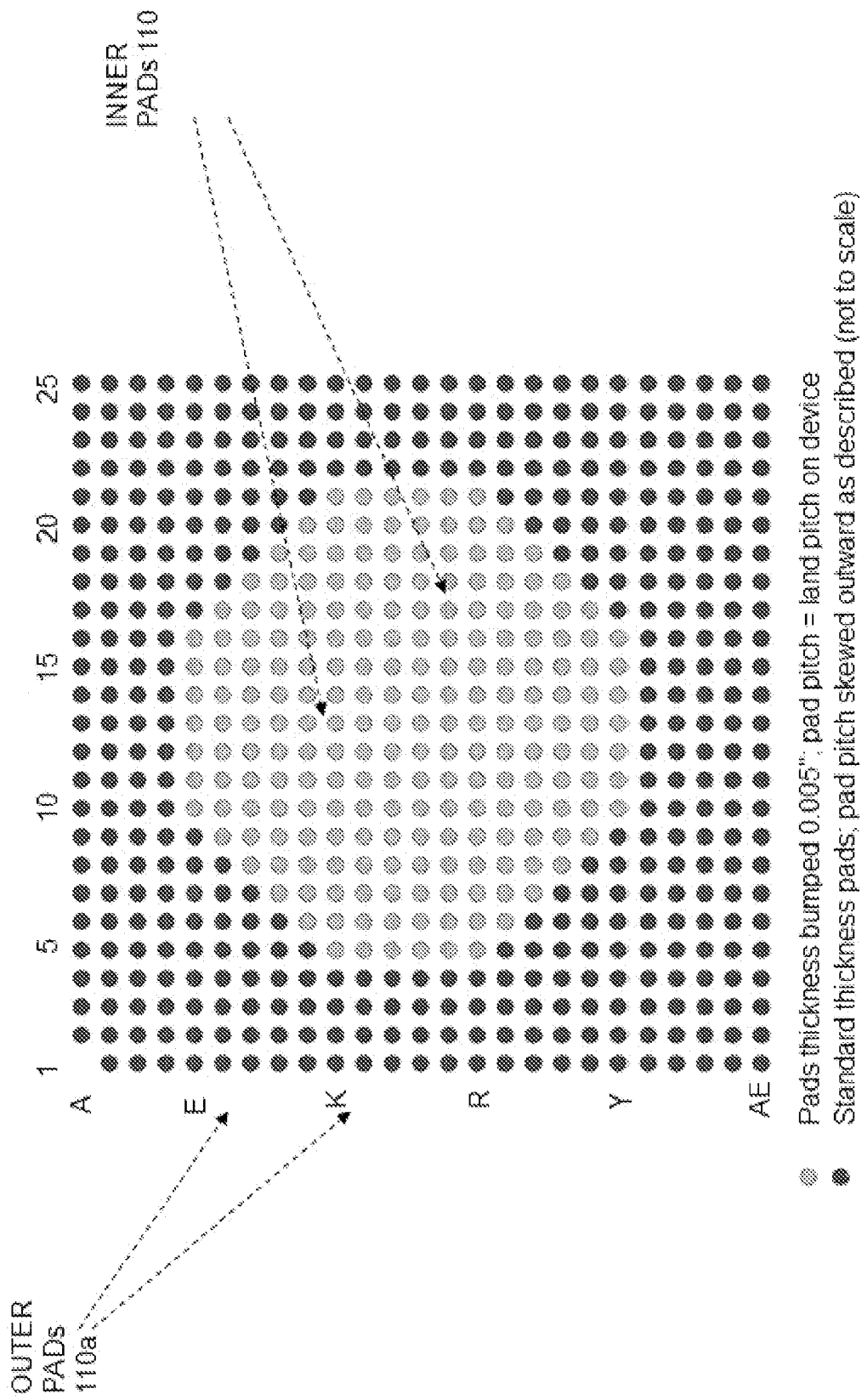
FIG. 4 further illustrates use of pads with reduced thickness, toward the periphery of the CGA.

FIG. 4 further illustrates that use of pads with reduced thickness, toward the periphery of the CGA, may be applied to the proposed approach. By keeping the center columns vertical, stability may be added to the part during solder liquidus. Making the center (vertical) columns longer gives the outer columns more flexibility to center on their respective pads and lands, bottom and top respectively. Since this is generally not feasible due to the way the parts are made (columns are ground co-planar after assembly), the same benefit may be realized by making the center pads on the PCB thicker. This can be done when the board is plated, as shown in FIG. 4.

FIG. 4 illustrates a central area of the part determined by a hexagon (or some other shape) where the pads are laid out in a Cartesian array (without skewing the pads, however, although not shown in FIG. 4, skewing 107 of pads outside of the central area is allowed), the pads in this region are plated up (or bumped) an additional 0.005 inches above the pads in the outer region. Pads 110 in the central area are therefore thicker than the outer pads 110a. Additional solder paste volume may bridge the gap. The additional solder paste may be facilitated by a solder paste printer.

The present trend towards higher powered packages, in both commercial and non-commercial applications, coupled with higher I/O counts and larger arrays, creates a need for an assembly method that improves the fatigue life of typical CGA. In one embodiment of the proposed approach, adapted for use with relatively large CGAs having a high number of columns and more particularly for devices having large area array configurations that require increased I/O requirements along with increased density. The present approach relies on the concept of reduction of the number of contractions and expansions of solder columns during thermal cycling of CGA and, as a result, improvement of expected life cycle of the assembled device.

As mentioned earlier, the proposed approach covers not just CGAs, but other electronic components as well, such as, but not limited to, GAs, CCGAs, PGAs, LGAs, and other types of grid arrays. Applications for the proposed approach are not limited, and may include commercial applications, non-commercial applications, video games, long mission aerospace applications, or other applications.

While this invention has been particularly shown and described with references to example embodiments thereof, it will be understood by those skilled in the art that various changes in form and details may be made therein without departing from the scope of the invention encompassed by the appended claims.

What is claimed is:

1. An electronic assembly comprising:
a printed circuit board having an array of connecting pads and a board coefficient of thermal expansion; and
an electronic component having an array of connecting lands, the electronic component having a different coefficient of thermal expansion than the board coefficient of thermal expansion, an array of conducting posts connecting the electronic component from the array of connecting lands to respective pads of the array of connecting pads on the printed circuit board through solder, angled conducting posts of the array of conducting posts having an angular tilt outwardly away from a center of the electronic component to the circuit board at 20 degrees Celsius and over a temperature range of 0 degrees Celsius to 100 degrees Celsius,
a first plurality of connecting pads of the array of connecting pads outside of a centered region of the printed circuit board being connected from a first plurality of connecting lands of the array of connecting lands of the electronic component by a first plurality of conducting posts of the array of conducting posts outside of a centered region of the electronic component, the first plurality of connecting pads having a same lesser pad thickness than a second plurality of the connecting pads of the array of connecting pads in the centered region of the printed circuit board being connected from a second plurality of connecting lands of the array of connecting lands of the electronic component by a second plurality of conducting posts of the array of conducting posts inside of the centered region of the electronic component having a same higher pad thickness, each of the conducting posts of the second plurality of the conducting posts connected through solder to the second plurality of connecting pads being vertical, and each of the conducting posts of the first plurality of the conducting posts connected through solder to the first plurality of connecting pads having an angular tilt, pads of the first plurality of connecting pads being spaced outwardly with respect to lands of the first plurality of connecting lands joined by respective conducting posts, adjacent pads of the second plurality of connecting pads having a same pad pitch spacing between each other that matches a land pitch spacing between corresponding adjacent lands of the second plurality of connecting lands, and pad pitch spacing of the second plurality of connecting pads being less than pad pitch spacing of the first plurality of connecting pads.

2. The assembly of claim 1, wherein the angled conducting posts include peripheral conducting posts that are peripheral with respect to the center of the electronic component.

3. The assembly of claim 1, wherein the board coefficient of expansion is greater than the electronic component coefficient of thermal expansion.

4. The assembly of claim 1, wherein the array of conducting posts is an array of conducting columns connected at lands of the electronic component with solder and connected to pads of the printed circuit board with solder.

5. The assembly of claim 1, wherein the angled conducting posts have the angular tilt outwardly away from the center of the electronic component to the circuit board over a temperature range of negative 55 degrees Celsius to 125 degrees Celsius.

6. The assembly of claim 1, wherein a first connective material connects each of the conducting posts of the array of conducting posts to the electronic component, and a second connective material connects each of the conducting posts of the array of conducting posts to a pad, the first connective material and the second connective material having a lower melting point than a melting point of each of the conducting posts of the array of conducting posts.

7. The assembly of claim 6, wherein the first connective material is solder and the second connective material is solder, and a length-to-width ratio of each of the conducting posts of the array of conducting posts is greater than or equal to a ratio of 4:1.

8. The assembly of claim 1, wherein each of the conducting posts of the array of conducting posts is comprised of solder, and each of the conducting posts of the array of conducting posts is connected to a land of the electronic component with solder.

9. The assembly of claim 1, wherein the angled conducting posts of the array of conducting posts have the angular tilt at an increasing angle toward a periphery of the electronic component.

10. The assembly of claim 1, wherein the angled conducting posts include outermost conducting posts of the electronic component, proximate to a periphery of the electronic component and at least conducting posts inward of the outermost conducting posts of the electronic component.

11. The assembly of claim 1, wherein the angled conducting posts of the array of conducting posts include peripheral conducting posts.

12. A device comprising:

an electronic component with a group of conducting posts connected to an array of connecting lands of the electronic component through solder, the electronic component having a first coefficient of thermal expansion;

a printed wiring board with a group of connecting pads, the printed wiring board having a second coefficient of thermal expansion greater than the first coefficient of thermal expansion;

the group of connecting pads placed on the printed wiring board, the group of connecting pads associated with the group of conducting posts on the electronic component, such that:

at least one pad of the group of connecting pads is aligned with an associated at least one conducting post of the group of conducting posts, and the at least one conducting post of the group of conducting posts is located centermost to the electronic component, where there is an initial gap distance which is a constant value, between any adjacent pads of the at least one pad of the group of connecting pads;

a remaining set of pads of the group of connecting pads is misaligned at 20 degrees Celsius with a corresponding set of the array of connecting lands of the electronic component, by creating increased gap distance between adjacent pads of the remaining set of pads of the group of connecting pads, the increased gap distance being greater than the initial gap distance; and the electronic component connects to the printed wiring board through a connection process such that:

each of the conducting posts of the group of conducting posts connects to an associated proximate pad of the group of connecting pads;

each of the conducting posts of the remaining set of conducting posts has an angular tilt outwardly away from the center of the electronic component toward a periphery of the electronic component at 20 degrees Celsius and over a temperature range of 0 degrees Celsius to 100 degrees Celsius, a first plurality of connecting pads of the group of connecting pads outside of a centered region of the printed circuit board being connected from a first plurality of connecting lands of the array of connecting lands of the electronic component by a first plurality of conducting posts of the array of conducting posts outside of a centered region of the electronic component, the first plurality of connecting pads having a same lesser pad thickness than a second plurality of the connecting pads of the group of connecting pads in the centered region of the printed circuit board being connected from a second plurality of connecting lands of the array of connecting lands of the electronic component by a second plurality of conducting posts of the array of conducting posts inside of the centered region of the electronic component having a same higher pad thickness, each of the conducting posts of the second plurality of the conducting posts connected through solder to the second plurality of connecting pads being vertical, and each of the conducting posts of the first plurality of the conducting posts connected through solder to the first plurality of connecting pads having an angular tilt, pads of the first plurality of connecting pads being spaced outwardly with respect to lands of the first plurality of connecting lands joined by respective conducting posts, adjacent pads of the second plurality of connecting pads having a same pad pitch spacing between each other that matches a land pitch spacing between corresponding adjacent lands of the second plurality of connecting lands, and pad pitch spacing of the second plurality of connecting pads being less than pad pitch spacing of the first plurality of connecting pads.

13. The device of claim 12, wherein the increased gap distance is a constant value.

14. An electronic assembly comprising:

a printed circuit board having an array of connecting pads and a board coefficient of thermal expansion;

an electronic component having coefficient of thermal expansion less than the board coefficient of thermal expansion, an array of conducting posts connected through solder to the electronic component at respective lands of an array of connecting lands of the electronic component, and connecting the electronic component to the printed circuit board, peripheral conducting posts of the array of conducting posts having an angular tilt outwardly away from the electronic component to the circuit board when the temperature is at 20 degrees Celsius and when the temperature is in a range of 0 degrees Celsius to 100 degrees Celsius;

solder connecting each of the conducting posts of the array of conducting posts to a respective land of the array of connecting lands of the electronic component and to a pad of the printed circuit board; and each of the conducting posts of the array of conducting posts being comprised of solder, a first plurality of connecting pads of the array of connecting pads outside of a centered region of the printed circuit board being connected from a first plurality of connecting lands of the array of connecting lands of the electronic component by a first plurality of conducting posts of the array of conducting posts outside of a centered region of the electronic component, the first plurality of connecting pads having a same lesser pad thickness than a second plurality of the connecting pads of the array of connecting pads in the centered region of the printed circuit board being connected from a second plurality of connecting lands of the array of connecting lands of the electronic component by a second plurality of conducting posts of the array of conducting posts inside of the centered region of the electronic component having a same higher pad thickness, each of the conducting posts of the second plurality of the conducting posts connected through solder to the second plurality of connecting pads being vertical, and each of the conducting posts of the first plurality of the conducting posts connected through solder to the first plurality of connecting pads having an angular tilt, pads of the first plurality of connecting pads being spaced outwardly with respect to lands of the first plurality of connecting lands joined by respective conducting posts, adjacent pads of the second plurality of connecting pads having a same pad pitch spacing between each other that matches a land pitch spacing between corresponding adjacent lands of the second plurality of connecting lands, and pad pitch spacing of the second plurality of connecting pads being less than pad pitch spacing of the first plurality of connecting pads.

* * * * *